United States Patent
Schäffer et al.

(10) Patent No.: US 9,417,293 B2
(45) Date of Patent: Aug. 16, 2016

(54) MAGNETIC FIELD SENSOR LINEARIZATION ARCHITECTURE AND METHOD

(71) Applicant: TEXAS INSTRUMENTS DEUTSCHLAND GmbH, Freising (DE)

(72) Inventors: Viola Schäffer, Freising (DE); Mikhail V. Ivanov, Freising (DE)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 399 days.

(21) Appl. No.: 14/141,684

(22) Filed: Dec. 27, 2013

(65) Prior Publication Data
US 2014/0184214 A1    Jul. 3, 2014

Related U.S. Application Data

(60) Provisional application No. 61/747,922, filed on Dec. 31, 2012.

(51) Int. Cl.
    *G01R 33/04* (2006.01)
    *G01R 33/00* (2006.01)

(52) U.S. Cl.
    CPC ............ *G01R 33/0041* (2013.01); *G01R 33/04* (2013.01)

(58) Field of Classification Search
    CPC ............................ G01R 33/0041; G01R 33/04
    USPC ........................................................ 324/253
    See application file for complete search history.

(56) References Cited

U.S. PATENT DOCUMENTS

| 5,736,848 | A | * | 4/1998 | De Vries | G01R 35/04 324/142 |
| 5,939,881 | A | * | 8/1999 | Slater | G01R 33/04 324/253 |
| 7,847,539 | B2 | * | 12/2010 | Machul | H03K 17/9512 324/202 |

OTHER PUBLICATIONS

Gottfried-Gottfried, R. et al., "A Miniaturized Magnetic-Field Sensor System consisting of a Planar Fluxgate Sensor and a CMOS Readout Circuitry", Transducers '95 and Eurosensors IX, The 8th International Conference on Solid-State Sensors and Actuators, vol. 2, 1995, pp. 229-232.

(Continued)

*Primary Examiner* — Reena Aurora
(74) *Attorney, Agent, or Firm* — Gregory J. Albin; Frank D. Cimino

(57) ABSTRACT

A method of processing an output signal and a readout circuit for a magnetic field sensor are disclosed. The purpose of the readout circuit is to generate a digital representation of the magnetic field vector strength. It comprises an input stage for receiving an output signal of the magnetic field sensor; an output stage for outputting a digital output signal corresponding to the sensor output signal; and an analog to digital conversion circuit. The analog to digital conversion circuit receives the sensor output signal and performs, in sequence, a fast conversion process for calculating a number of most significant bits of the digital output signal corresponding to the sensor output signal and for generating a compensation signal, and a delta sigma based conversion process for calculating at least one least significant bit of the digital output signal. The compensation signal is fed back to the sensor input for linearization. The delta sigma based conversion takes advantage of oversampling and noise shaping to increase resolution.

19 Claims, 5 Drawing Sheets

(56) References Cited

OTHER PUBLICATIONS

Kawahito, S. et al., "A Digital Fluxgate Magnetic Sensor Interface using Sigma-Delta Modulation for Weak Magnetic Field Measurement", IEEE Instrumentation and Measurement Technology Conference, 2002, vol. 1, pp. 257-260.

Gayral, F. et al., "Sigma-Delta closed-loop digital microfluxgate magnetometer", Electronics, Circuits and Systems, 2006. 13th IEEE International Conference, pp. 276-279.

* cited by examiner

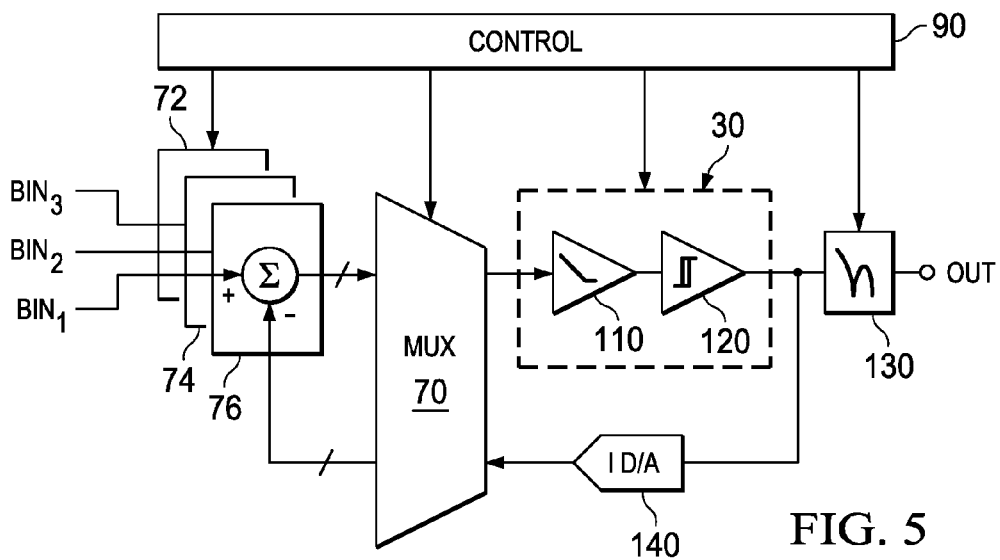
FIG. 5
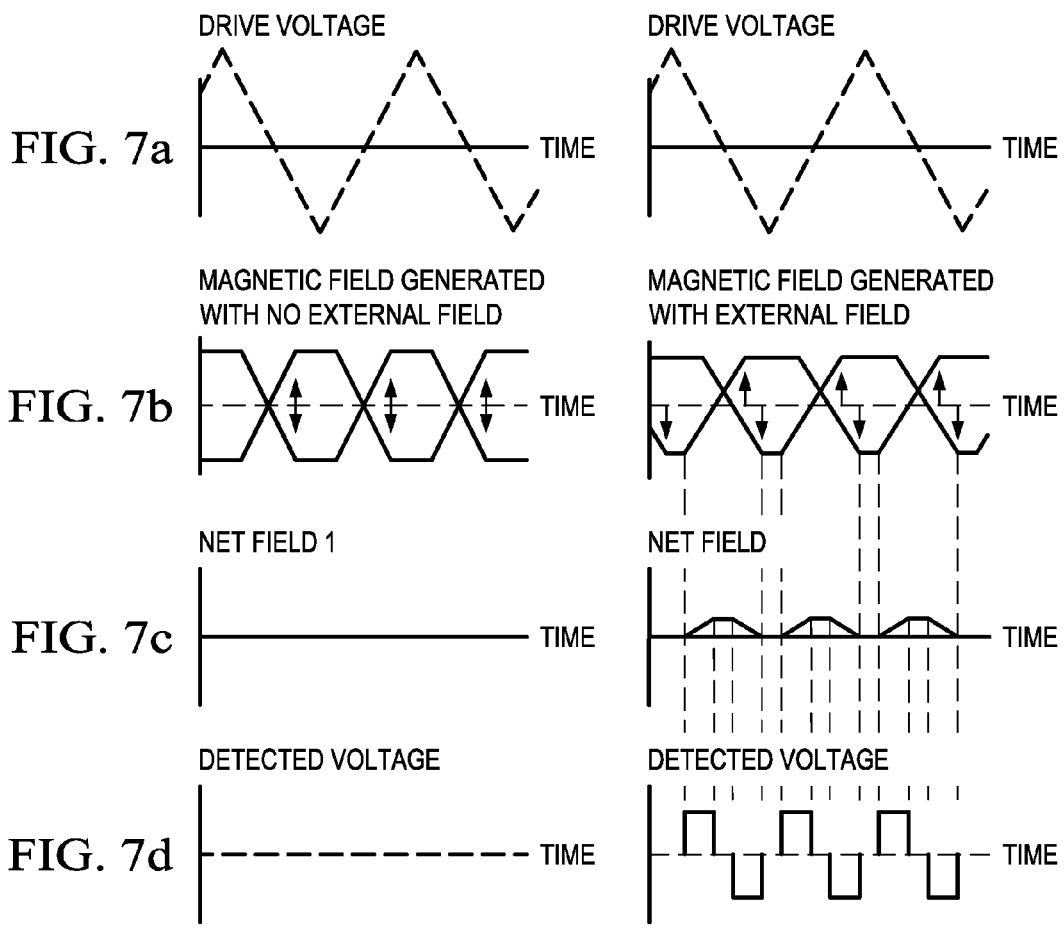
FIG. 7a
FIG. 7b
FIG. 7c
FIG. 7d

MAGNETIC FIELD SENSOR LINEARIZATION ARCHITECTURE AND METHOD

The application claims the benefit of U.S. Provisional Application No. 61/747,922, filed Dec. 31, 2012, the entirety of which is hereby incorporated by reference.

FIELD OF THE INVENTION

The invention relates to a magnetic field sensor linearization architecture and method and, more particularly, to a read-out circuit and method for a magnetic field sensor.

BACKGROUND

Magnetic field sensors are widely used for isolated current measurement, electronic compasses, position sensors, etc. While some applications, such as current sensing, still primarily operate in the analog domain, other applications such as navigation aids require digital output for easy integration into more complex systems. The present design is particularly applicable, but not limited to, digital output magnetic sensor systems. Possible applications are industrial navigation systems, mobile devices including position sensing and navigation systems, non-invasive sensing of weak magnetic fields and different types of consumer applications.

Examples of magnetic field sensors or magnetic field sensors are Hall-effect magnetometers using Hall plates, fluxgate magnetometers, and magneto-resistive sensors, without being limited to this type of sensors. Magnetic sensors or magnetometers provide an electric signal which is a function of an external magnetic field applied to the sensor. Recent progress in fabrication technologies has enabled the development of miniaturized fluxgate sensors, called micro fluxgate sensors which allow the development of new applications, such as portable electronic compasses, which require low-cost, low power, low noise integrated accurate magnetic field sensors. Digital interfaces can be well adapted to fluxgate magnetometers and miniaturized fluxgate magnetometers, considering their simple implementation in regard to high performance and adjustability.

The following description will focus on fluxgate magnetic sensors but the approach is equally applicable to Hall-based magnetic sensors as well as other magnetic field sensors or magnetometers.

There is a number of demands which a digital magnetic sensor solution should meet, in particular when the solution is to be provided for a mobile application. Primary specifications are low-power dissipation, small size and low costs, but also high sensitivity and high resolution. The architecture described has been developed to improve on currently-available sensors and associated signal acquisition electronics in one or more of these aspects.

Hall-effect magnetometers produce a voltage proportional to the applied magnetic field and also are able to sense polarity. They easily lend themselves to digitization but due to their low sensitivity are useful mainly in applications where the magnetic field strength is relatively large.

Fluxgate magnetometers provide a higher sensitivity and hence are useful also in applications where the magnetic field is weak and changing slowly. A fluxgate magnetometer consists of a small, magnetically susceptible core wrapped by two coils of wire. An alternating electrical current is passed through one coil, driving the core through an alternating cycle of magnetic saturation; i.e., saturated, unsaturated, inversely saturated, unsaturated, saturated, and so forth. This constantly changing field induces an electrical voltage or EMF (electro-magnetic force) in the second coil, and this output signal is measured by a detector. In a magnetically neutral background, the EMF generated in the two core halves will have the same magnitude but will be opposite in direction so that it will add up to zero. However, when the core is exposed to a background field, it will be more easily saturated in alignment with that field and less easily saturated in opposition to it. Hence the EMF induced in the two core halves will be out of step. The extent to which this is the case will depend on the strength of the background magnetic field and will determine the output signal of the sensor.

Fluxgate magnetometers offer low noise and high sensitivity but the output signal is depending on the magnetic properties of the core material and it is inherently non-linear. To improve measurement precision, the sensors are often operated in a closed-loop configuration. In this operation mode, a magnetic field is generated via a compensation current flowing through the loops of a sensor coil or an independent compensation coil to oppose the external magnetic field that the sensor sees. The compensation current is generated based on the sensor output and the amount of compensation current is regulated by feedback to be proportional to the external field. By feeding back the compensation current, the response of the sensor can be made linear. Different solutions have been proposed as signal acquisition electronics for fluxgate magnetometers: R. Gottfried-Gottfried et al. describe in "A Miniaturized Magnetic-Field Sensor System consisting of a Planar Fluxgate Sensor and a CMOS Readout Circuit", Sensors and Actuators, Volume 54, June 1996, pages 443-447, a signal acquisition electronics to be used with a fluxgate sensor wherein the fluxgate output is amplified, demodulated and filtered and used to generate a compensation current. A separate analog-to-digital converter generates the digital output signal of the electronics. This solution requires high precision analog blocks and hence is larger and requires high power. It also is inherently slow due to the amount of filtering required in the feedback. S. Kawahito et al. describe in "A Digital Fluxgate Magnetic Sensor Interface using Sigma-Delta Modulation for Week Magnetic Field Measurement", IEEE Instrumentation and Measurement Technology Conference, Anchorage, USA, 21.-23. May 2002, pages 257 to 260, micro fluxgate sensors using a delta-sigma converter with a one-bit feedback DAC for generating a compensation current which is applied to a feedback coil. The feedback coil generates a magnetic field which compensates the measured external field. Also this approach requires additional filtering and is inherently slow. F. Gayral et al. describe in "A Sigma-Delta Closed-Loop Digital Micro-Fluxgate Magnetometer", 13th IEEE International Conference on Electronics, Circuits and Systems, 2006, pages 276-279, an architecture for micro field sensors including a delta-sigma converter with multi-bit feedback DAC for generating a compensation current. The multi-bit feedback is generated based on the digital output of the sensor electronics. This approach suffers from high latency which translates into lower throughput and higher power requirements on the system level.

The three documents cited above provide a discussion on the function of fluxgate sensors and different approaches of signal acquisition. These documents are incorporated herein by reference.

SUMMARY

The present invention, in one aspect thereof, provides a read-out circuit for a magnetic field sensor, which generates a digital representation of the magnetic field vector strength.

The circuit comprises an input stage for receiving an output signal of the magnetic field sensor; an output stage for outputting an digital output signal corresponding to the sensor output signal; and an analog to digital conversion circuit configured to receive the sensor output signal and to perform, in sequence, a fast conversion process for calculating a number of most significant bits of the digital output signal corresponding to the sensor output signal and for generating a compensation signal, and a delta sigma based conversion process for calculating at least one least significant bit of the digital output signal. The compensation signal is fed back to the magnetic field sensor for linearization. The delta sigma based converter takes advantage of oversampling and noise shaping to increase resolution.

According to another aspect, the present invention provides a method of processing an output signal of a magnetic field sensor, the method comprising the steps of: receiving the output signal of the magnetic field sensor; performing an analog to digital conversion of the received sensor output signal wherein said step of performing includes, in sequence: performing a fast conversion process for calculating a number of most significant bits of a digital output signal corresponding to the sensor output signal and for generating a compensation signal to be fed back to a sensor input, and performing a delta sigma based conversion process for calculating at least one least significant bit of the digital output signal; feeding back said compensation signal to the magnetic field sensor; and combining the most significant bits and the at least one least significant bit for generating the digital output signal corresponding to the sensor output signal and outputting the digital output signal.

In a further aspect, the invention provides a system for a magnetic field sensor, the system including: an input stage for receiving an output signal of the magnetic field sensor; an output stage for outputting an digital output signal corresponding to the sensor output signal; an analog to digital conversion unit, including an integrator and a comparator, configured to receive the sensor output signal and to perform, in sequence, a fast conversion process for calculating a number of most significant bits of the digital output signal corresponding to the sensor output signal and for generating a compensation signal to be fed back to the sensor input, and a delta sigma based conversion process for calculating at least one least significant bit of the digital output signal; and a filter and control unit for combining the output of the fast conversion process and the output of the delta sigma based conversion process to generate the digital output signal; wherein the output of the fast conversion process is used for generating the mean value of the compensation signal.

In a more general aspect, the invention provides a readout circuit for a sensor, which generates a digital representation of a physical entity detected by the sensor. The circuit comprises an input stage for receiving an output signal of the sensor; an output stage for outputting an digital output signal corresponding to the sensor output signal; and an analog to digital conversion circuit configured to receive the sensor output signal and to perform, in sequence, a fast conversion process for calculating a number of most significant bits of the digital output signal corresponding to the sensor output signal and for generating a compensation signal, and a delta sigma based conversion process for calculating at least one least significant bit of the digital output signal. The compensation signal is fed back to the sensor for linearization. The delta sigma based converter takes advantage of oversampling and noise shaping to increase resolution. The sensor is configured for detecting a physical entity and the readout circuit is configured to generate a feedback quantity in the domain of the physical quantity that the sensor is measuring. The physical entity detected by the sensor can be e.g. a magnetic field strength, an electromagnetic field strength, a current value, a voltage value, an electric charge, a pressure, a thermodynamic entity, a temperature value, a light intensity, and a sound intensity, without being limited thereto.

As in the prior art, to improve measurement precision, the magnetic sensor is operated in a closed-loop configuration where a compensation signal is generated based on the sensor output and is fed back to the sensor input. The compensation signal may be a compensation current that flows through a sensor coil or a separate compensation coil to generate a magnetic field opposite to the external magnetic field that the sensor sees. The amount of the compensation signal should be proportional to the external field so that the response of the sensor becomes linear.

Inventors have recognized that this sensor linearization does not require the same level of accuracy as the overall signal acquisition. Approaches according to this invention partition the analog-to-digital conversion of the sensor output signal into a fast converging algorithm based conversion for determining the most significant bits of the digital output signal and for determining the compensation signal level, and a delta sigma based conversion for computing the least significant bits of the digital output signal. Examples of the fast conversion algorithm are successive approximation (SAR), cyclic analog-to-digital conversion and slope conversion, without being limited thereto.

In one embodiment, successive approximation is used as the fast conversion process as this is a common example of a fast converging algorithm. It should be noted that, when the following description makes reference to successive approximation, this is only an example of a fast conversion process and the invention is not limited thereto. The principles of the invention can be translated to other conversion algorithms.

The approaches of this invention have several benefits. In a first conversion phase, used for calculating the most significant bits of the digital output signal, an N-bit accurate compensation current can be calculated within a small number of clock cycles, such as less than 20 cycles, less than 12 cycles, less than 10 cycles, or 5 to 8 cycles, N corresponding to the number of cycles. In this first phase, a feedback current signal can be generated which converges fast to a relatively high accuracy, for example an 8-bit accurate compensation current within 8 clock cycles. At the same time, the N (e.g. 8) most significant bits of the digital output signal are generated. This reduces the latency of the conversion process which in turn enables higher throughput and lower system level power. After a predetermined number of clock cycles, or as a function of another suitable criteria, the first, fast conversion, phase terminates and a second, precision conversion phase starts. This second or precision conversion phase employs a delta sigma based conversion process for generating the least significant bits of the digital output signal so as to provide an overall output signal having a desired higher resolution. Delta sigma converters provide the advantage of having an oversampling architecture which allow to optimize the delta sigma converter to provide for low noise. The use of an additional filter allows for noise shaping so that the noise spectrum can be shifted outside of the effective bandwidth.

The same circuitry can be reconfigured between the two operating modes. The partitioning of the conversion into two phases avoids high precision demands on the individual circuit blocks so that the solution is area efficient. As the number of iterations for generating the compensation signal and hence required to stabilize the system is small, power dissipation can be reduced by 60 to 75% when compared to prior art systems.

BRIEF DESCRIPTION OF THE DRAWINGS

Reference is now made to the following descriptions:

FIGS. 3a-3e show signals generated in and associated with the sensor example of FIG. 2;

FIG. 5 shows a schematic block diagram of another example of a sensor system including a fluxgate sensor and signal acquisition electronics for a multi-channel application;

FIGS. 7a-7c schematically shows a number of signals generated in a fluxgate sensor.

DETAILED DESCRIPTION

The architecture and method of this invention, to a large extent, will be described with reference to a readout-circuit for a magnetic field sensor, more particularly, a fluxgate sensor. However, it is to be understood that this is only one of several examples for using the invention and the disclosed architecture and method can also be used in combination with other types of sensor which detect a physical entity.

For assisting in understanding how embodiments of this invention can be used, first, the principles of a fluxgate sensor will be described with reference to FIGS. 6 and 7.

Figure 6A:
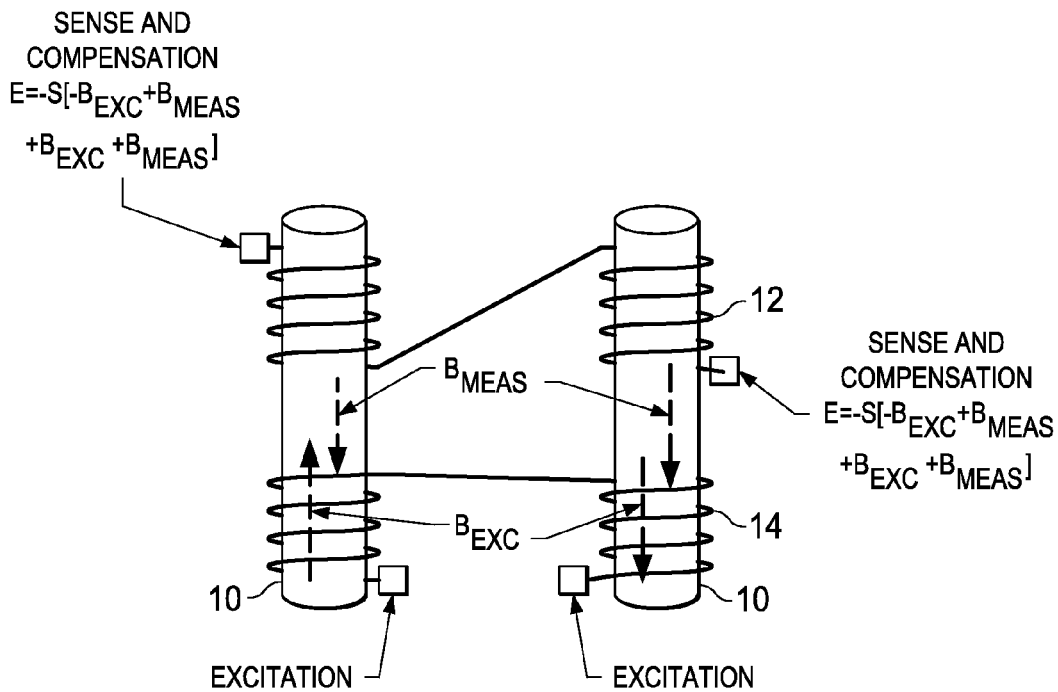
FIG. 6a schematically shows a rod core fluxgate sensor.
Figure 6B:
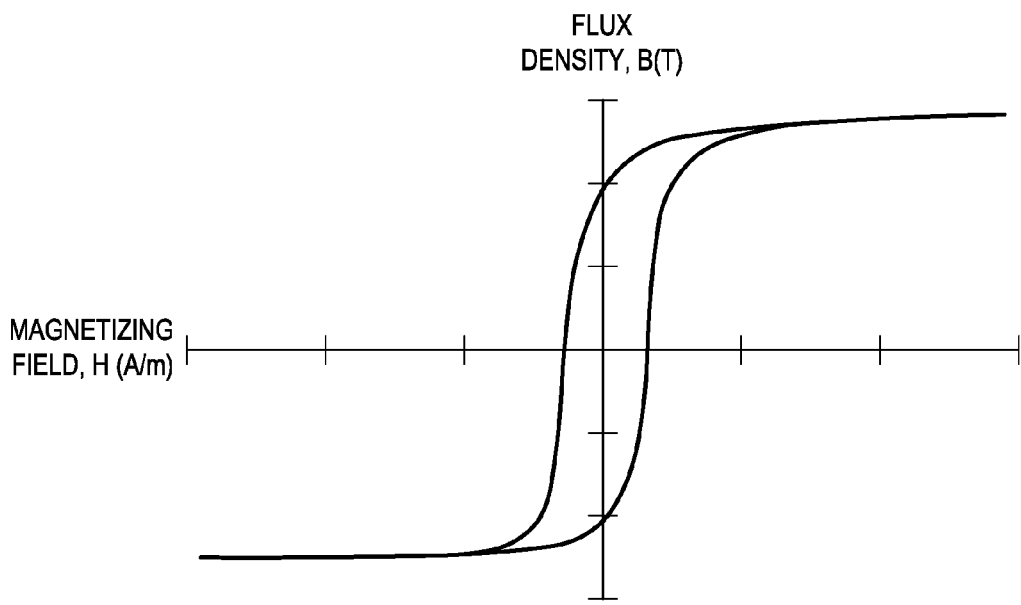
FIG. 6b shows a magnetizing, BH, curve of a fluxgate sensor.

FIG. 6a shows an example of a rod core fluxgate sensor, and FIG. 6b shows a magnetization (or BH) curve of a ferromagnetic material on which the fluxgate principle is based, for illustrating the environment in which the invention can be used, without limiting the invention to the use of a fluxgate sensor. The rod core fluxgate sensor of FIG. 6a comprises two rod-shaped core halves 10, which carry a sense and feedback coil 12 and an excitation or drive coil 14. The sense and feedback coil 12 can be used both for outputting a measurement signal corresponding to the external magnetic field experienced by the sensor and for receiving a compensation current for generating a magnetic field opposite to the external magnetic field, as explained in further detail below. Alternatively, a fluxgate sensor having a separate compensation coil could be used. The measurement current output by the sense and feedback coil can be integrated, yielding an output analog voltage which is a function of the external magnetic field vector strength. An alternating current is applied to the drive coil 14, which drives the core 10 into positive and negative saturation. The frequency of the drive current can be in the range of several kHz to several ten MHz, for example.

In the absence of any external magnetic field, the EMF generated in the coil surrounding one core half cancels that in the other, and so the total signal at the sense coil 12 is zero. If an external magnetic field is present, it will, at any given instance in time, increase the field in one core half and oppose the field in the other. This causes a net field imbalance between the halves of the core 10. Accordingly, current or voltage pulses are induced in the sense coil 12 at each drive current phase reversal. This results in an output signal of the sense coil 12 that is dependent on both the external field strength and polarity.

As shown in FIG. 6a, the excitation coil 14 is wound on the two core halves 10 in such a way that it generates magnetic field components of equal amount but opposite directions. On the other hand, the sense coil 12 is wound on the two core halves with equal winding direction and hence will measure twice the magnetic field strength experienced by the sensor. Accordingly, the resulting electromagnetic force E can be expressed as $E=-S(-B_{EXC}+B_{MEAS}+B_{EXC}+B_{MEAS})$, wherein $B_{EXC}$ and $B_{MEAS}$ represent the magnetic field vector strength generated by the excitation coil and an external magnetic field, respectively; and S is the gain or scaling factor of the sensor. It can be recognized that by appropriately arranging the excitation coil and the sense and compensating coil, the magnetic field generated by the excitation coil can be cancelled whereas the effect of the external magnetic field can be enhanced.

FIG. 6b shows an exemplary magnetization curve of a fluxgate sensor which receives a periodic excitation by an alternating drive current. The curve of FIG. 6b shows, among others, the nonlinearity of the core saturation which is a function of the magnetizing field. While the magnetization curve is symmetrical when no external field is applied to the sensor, any external field causes a non-symmetry of the curve which is detected in the sense coil.

FIG. 7a-7d show, in comparison, the signals generated in a fluxgate sensor wherein a curve shows an example of a drive voltage applied to the excitation coil 14 of FIG. 6a, for example. The drive voltage is shown to have a zig-zag shape but, of course, can have any other suitable shape, such as a sine-wave or a pulsed signal.

When no external magnetic field is present, the drive voltage will generate in the two-core halves the magnetic field shown on the left-hand side of FIG. 7b. It can be recognized that the magnetic fields are equal in strength but opposite in direction. When, however, an external magnetic field is present, depending on the direction of this external magnetic field, the magnetic field in one core half will be increased and the magnetic field in the other core half will be decreased. The resulting magnetic field in the two-core halves is shown on the right-hand side of FIG. 7b.

FIG. 7c shows the net magnetic field of the two-core halves which, with no external magnetic field present, cancel each other, as shown on the left-hand side of FIG. 7c. When, however, an external magnetic field is present, there will be a net magnetic field remaining, as shown on the right-hand side of FIG. 7c.

Accordingly, the fluxgate sensor will output a detection voltage which, if no external magnetic field is present, will be zero, as shown on the left-hand side of FIG. 7d. If, on the other hand, an external magnetic field is present, resulting in the net field shown in curve of FIG. 7c (right-hand side), the fluxgate sensor will output a detection voltage at each transition of the resulting magnetic field.

Due to the magnetic properties of the material of the fluxgate core, fluxgate sensors are inherently non-linear. Any data acquisition electronics hence should compensate for this sensor non-linearity. Recognizing that the sensor linearization does not require the same accuracy as the overall conversion, the inventors have proposed a solution which is based on a two-stage conversion, including a fast-converging conversion algorithm and a slower high-precision conversion algorithm. In this approach, as one example, a compensation current could be generated based on a feedback compensation signal having an 8-bit accuracy determined by the fast conversion algorithm whereas the final digital output signal of the signal acquisition electronics could have a 12-bit or higher accuracy level, without limiting the invention to this example.

Figure 1:
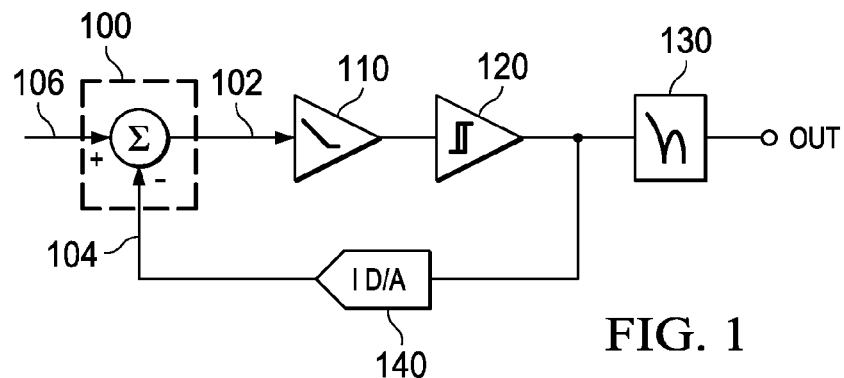
FIG. 1 shows a schematic block diagram of an example of a sensor readout circuit, on a high abstract level.

FIG. 1 shows, in a simplified block diagram, an example of a sensor readout circuit, on a relatively high abstract level. The sensor is schematically shown at 100 and can be any sensor for detecting a physical entity, such as a magnetic field strength, an electro magnetic field strength, a temperature value, a light intensity, a sound intensity, etc. without being limited thereto. The readout circuit comprises an integrator unit 110 which receives the output signal of the sensor 100, a comparator 120 which receives the output signal of the integrator unit 120, and a filter and digital control unit 130 which receives the output signal of the comparator 120. The integrator 110, comparator 120, and filter and digital control unit 130 together form an analog-to-digital converter for generating a digital output signal OUT based on the sensor output, as will be explained in further detail below. The output of the comparator 120 further is connected to a feedback digital-to-analog converter (DAC) 140 which generates a feedback signal from the comparator output, the feedback signal to be applied to the sensor for linearization, as will be explained in further detail below. The feed back signal is in the domain of the physical entity which the sensor is measuring. If the sensor 100 is a fluxgate sensor, for example, the output 102 would correspond to the sense coil and the feedback input 104 would correspond to the compensation coil, which can be separate from or integrated with the sense coil. The input 106 symbols the external magnetic field applied to the sensor 100.

Figure 2:
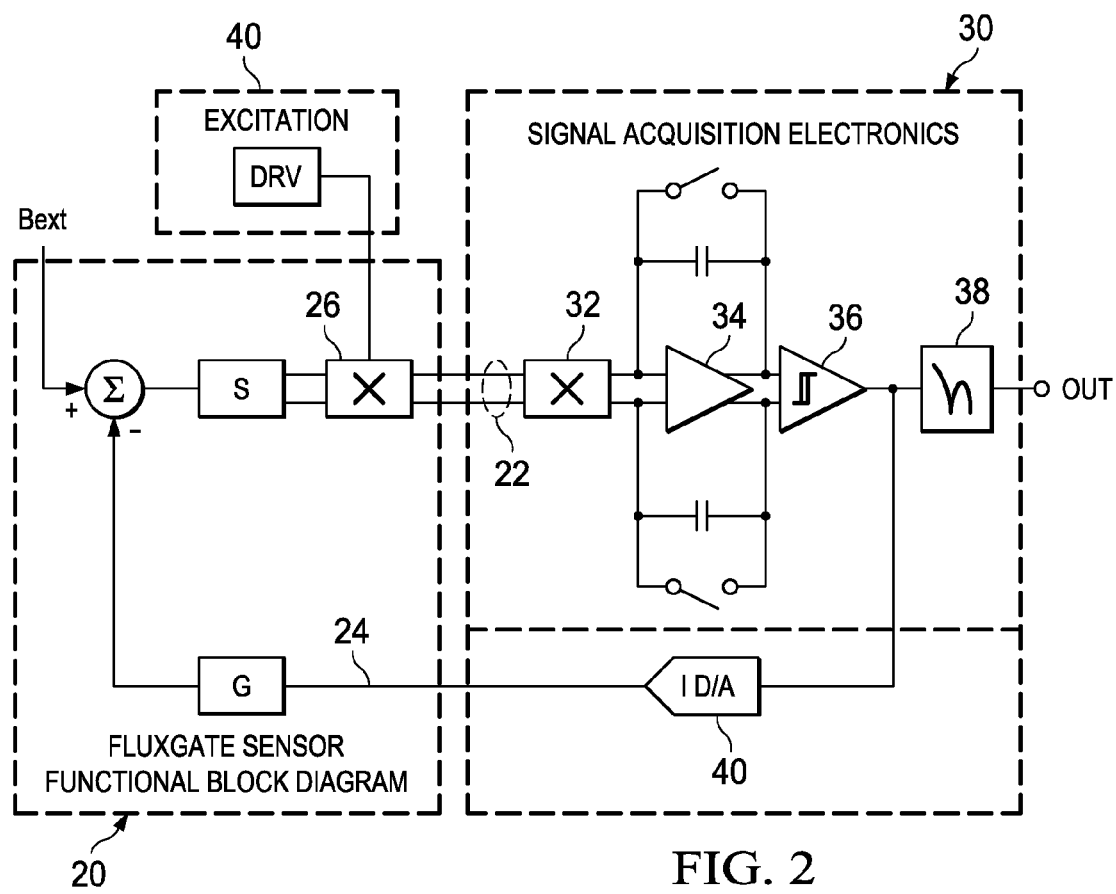
FIG. 2 shows a schematic block diagram of an example of a sensor system including a fluxgate sensor and signal acquisition electronics.

FIG. 2 shows, still in a simplified block diagram but with further details, one example of a system including a fluxgate magnetic sensor 20 and associated signal acquisition electronics 30 which is used as readout circuit. The fluxgate magnetic sensor 20 is schematically shown to comprise a sensor coil 22 and a compensation coil 24 and a modulator 26. In this example, separate sense and compensation coils 22, 24 are provided wherein it also is possible to combine the functions of sensing and compensation within the same coil, just as it is also possible to use different types of magnetometers.

An external magnetic field Bext is applied to the fluxgate sensor 20 and causes measurement current or voltage pulses to be generated in the sense coil 22 when an alternating drive current is applied to the fluxgate sensor 20. The alternating drive current is generated by a drive unit 40. The excitation or drive current can be a zigzag curve, a sine wave or a pulse excitation, for example, wherein pulse excitation might be more efficient in terms of low power dissipation. The drive current must be high enough to drive the core into saturation; and the frequency should be high enough to have good sensitivity and could be in the range of several kHz to several 10 MHz, for example.

The S and G blocks in FIG. 2 indicate the sensitivity and the gain of the fluxgate sensor 20 wherein the sensitivity S symbols the conversion of magnetic flux to electromagnetic force (EMF) and the gain G symbols the conversion of current to magnetic flux. The sum Σ symbols the generation of the net magnetic field in this sensor in which the external magnetic field and the magnetic field due to the compensating current are combined.

As explained in further detail below, the data acquisition electronics 30 generates a compensation current which is applied to the compensation coil 24 which in turn generates a compensating magnetic field opposite to the external magnetic field Bext. Ideally, the compensating magnetic field generated by the compensation coil 24 and the external magnetic field Bext cancel each other and, in this case, the amount of the compensation current is proportional to the external magnetic field and the response of the sensor is linear.

The data acquisition electronics 30 comprises a demodulator and rectifier unit 32 which receives the output signal of the fluxgate sensor 20, an integrator unit 34 which receives the output signal of the demodulator 32, a comparator 36 which receives the output signal of the integrator unit 34, and a filter and digital control unit 38 which receives the output signal of the comparator 36. The integrator 34, comparator 36, and filter and digital control unit 38 together form an analog-to-digital converter for generating a digital output signal OUT based on the sensor output. The output of the comparator 36 further is connected to a feedback digital-to-analog converter (DAC) 40 which generates a feedback current from the comparator output, the feedback current to be applied to the compensation coil 24.

In the proposed example, the same hardware can be used in both operation modes, i.e. for performing the fast conversion algorithm and the delta-sigma based conversion.

In one example, the fast conversion process includes successive approximation (SAR). As explained in further detail below, in the SAR mode, the integrator unit 34 is reset between each clock cycle and the sensor output signal (i.e. the input signal to the data acquisition electronics) is sampled at each cycle. The output of the comparator 34 is then used to generate the DC value of the compensation current to be applied to the compensation current coil 24 via the feedback DAC 14. The output of the comparator 36 also determines the sign and most significant bits (MSB) of the digital output signal OUT of the data acquisition electronics.

In the delta-sigma conversion mode, the least significant bit (LSB), or several LSBs for overlap, are determined using the same integrator unit 34 and comparator 36 as well as the filter and digital control unit 38. The output bit stream is filtered by the filter and control unit 38 and combined with the most significant bits (MSB), determined earlier during the first SAR phase, to provide the final digital representation OUT of the magnitude of the external magnetic field Bext.

As explained above, the compensation current to be applied to the compensation coil 24 is derived during the first operation mode, i.e. the fast converging conversion process, such as SAR, wherein the feedback DAC 40 converts the output signal of the comparator 30 to the compensation current. The feedback DAC 40 can optionally include a toggle function wherein the least significant bit of the compensation signal (output of comparator 36) is toggled based on the result of the delta-sigma based conversion, as explained in further detail below.

The operation of the data acquisition electronics 20 can be controlled by a superordinate control unit (not shown in FIG. 2) which controls the analog-to-digital converter to function in the first or second mode and which further controls the filter and digital control unit 38 and the drive unit 28. The described conversion algorithms can be implemented in hardware, in particular as an integrated circuit, in software, firmware or a combination thereof FIGS. 3a-3e show signal sequences at various locations of the data acquisition electronics of FIG. 2, by way of example. The first signal sequence (curve A) represents the comparator (36) output signal showing the first, fast conversion process (coarse phase) and the second, delta-sigma based conversion process (fine phase) in sequence. The comparator output signal simply indicates whether the output current of the fluxgate sensor is larger or smaller than the feedback current applied to the compensation coil or, whether the external magnetic field is larger or smaller than the compensation magnetic field. If yes, the comparator output is at a high level and, if no, the comparator output is at a low level. Expressed differently, the comparator 36 fires (output high) if its input is larger than zero.

The goal of the first conversion phase (coarse conversion phase) is to quickly converge to the mean compensation current that is required for sensor linearization and provide sign and magnitude information about the magnetic field. One method to implement this phase is using a SAR algorithm, without being limited to this method.

In the SAR algorithm the system starts out with zero feedback current and with x, the index for the conversion cycle, at 0. The sensor is excited and the output at the end of the excitation cycle is examined. If it is larger than zero then the feedback current Ifb is increased by $IFS/2^{X+1}$ Otherwise it is decreased by $IFS/2^{X+1}$ wherein IFS is the maximum value of the compensating feedback current. The index x is incremented by one, x=x+1, and cycle is completed. The process is repeated N+1 times to complete the coarse phase.

This first, fast conversion phase, proceeds for a predetermined number of cycles, for example 6, 8, 10 or 12 cycles, without being limited thereto. The result of this first fast conversion phase is used as a starting point for the second, precision conversion phase, using delta-sigma based conversion.

Figure 3A:
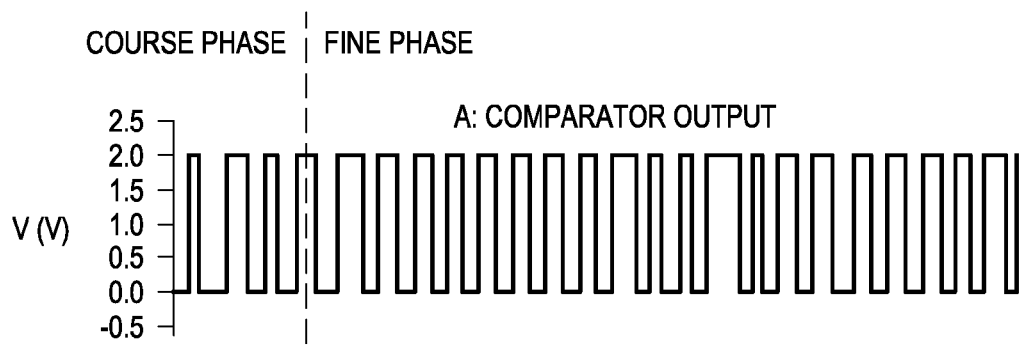
Figure 3B:
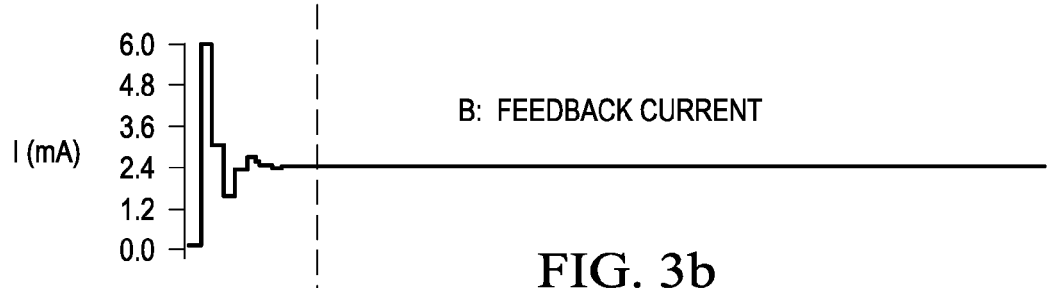
Figure 3C:
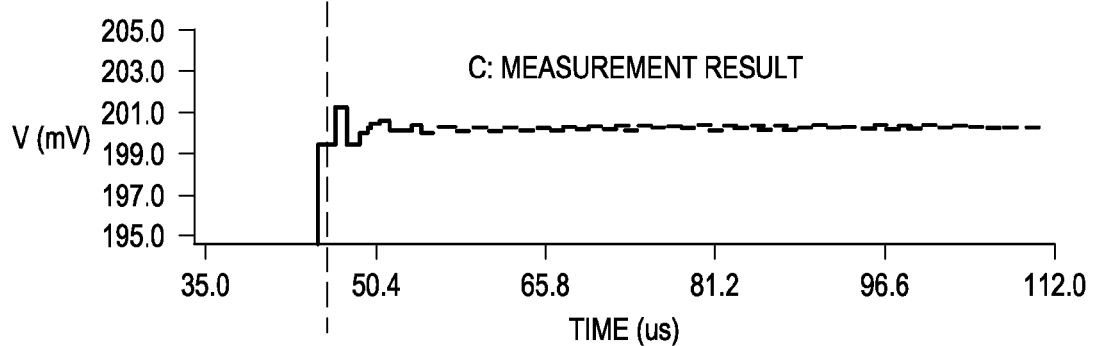

This first conversion phase, using SAR for example, rapidly converges to a value which is sufficiently accurate to derive a feedback compensation current therefrom, even if it is not sufficiently accurate as a final measurement result; see curve B in FIG. 3b.

To achieve the final accuracy the advantages of oversampling and noise shaping properties of delta sigma conversion is used. For this second, delta-sigma based conversion mode (fine conversion phase), the same hardware can be used, albeit using a different control algorithm. If the comparator output is 1, the feedback compensation signal is increased by one or more least significant bits, otherwise it is decreased. While one least significant bit can be used, using two or more least significant bits will make the system more robust because some overlap is added.

The output of the comparator (curve A) in the second, delta-sigma based conversion also is used to determine the least significant bits of the final digital output signal. Positive decisions of the comparator result in a high logic value and negative decisions in a low logic value to be outputted for the bit-stream bs[y]. The filtered value of the continuous bit-stream is the output of the fine conversion.

The ratio of the counter y to the total number of cycles is the output of the fine conversion. The resolution of the delta-sigma conversion will depend on the desired oversampling rate and is limited only by the output data rate desired. These least significant bits are combined with the more significant bits determined during the coarse conversion phase to derive the final digital output which is output as measurement result; see curve C.

Figure 4B:
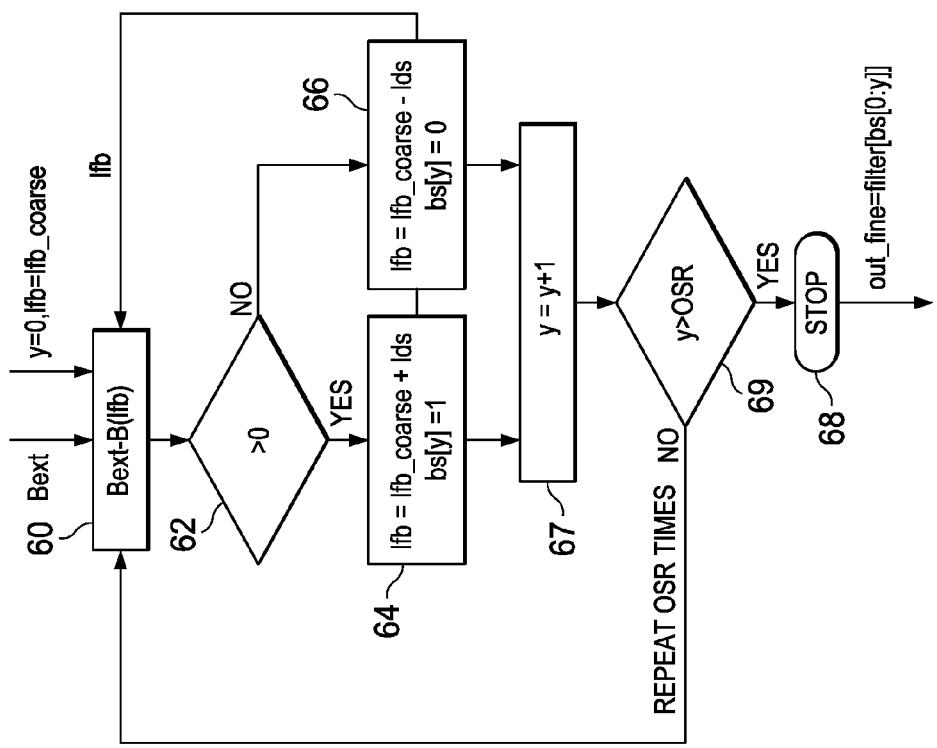
FIG. 4B shows a flow diagram of a delta sigma based conversion process.
Figure 4A:
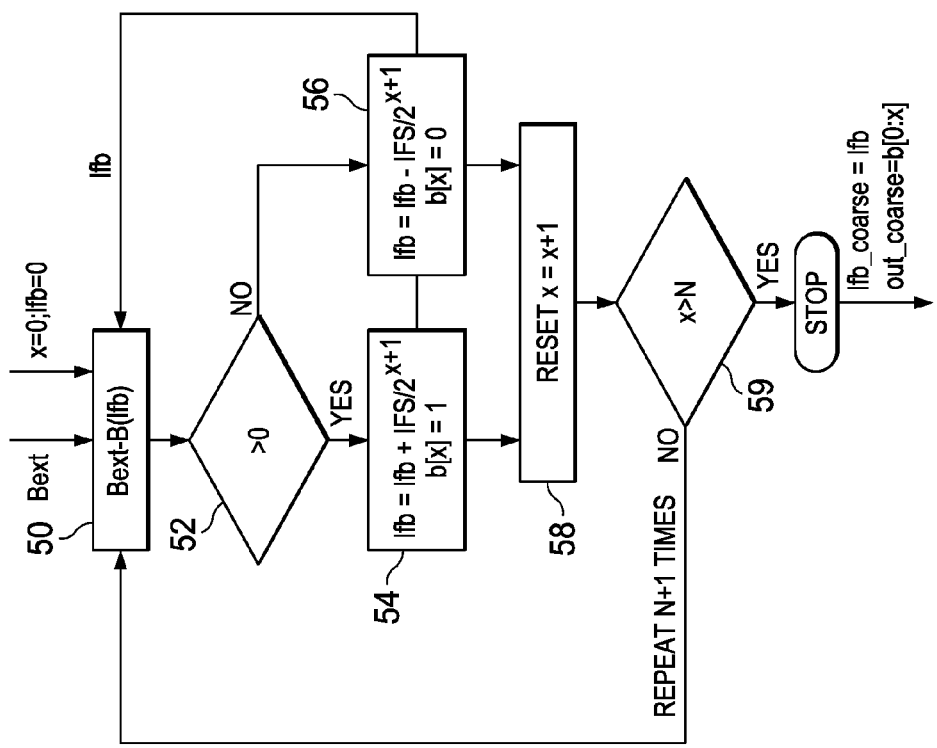
FIG. 4A shows a flow diagram of a fast conversion process.

Flowchart representations of the algorithms used in the two operation modes are shown in FIGS. 4a and 4b. FIG. 4a corresponds to the fast conversion process, wherein an SAR algorithm is shown by way of example. FIG. 4b depicts a delta-sigma based conversion process.

The SAR mode, shown in FIG. 4a is the adaptation of a well-known algorithm, described for example in D. A. Johns; K. Martin Analog Integrated Circuit Design; pg. 505.

At the beginning of the SAR mode, it is assumed that an external magnetic field Bext is applied to the fluxgate sensor; x=0 and Ifb=0. There is no compensation current Ifb yet and hence there is no compensating magnetic field.

In a first step 50, the resulting magnetic field Bext−B(Ifb) is determined. In a practical implementation, this resulting magnetic field is reflected by current or voltage spikes of the magnetic sensor output. In step 52, it is determined whether the resulting magnetic field is larger than 0, the determination result corresponding to the comparator output in the particular example explained with reference to FIGS. 2 and 3. If, in step 52, it is decided that the resulting magnetic field is larger than zero, the feedback compensation current Ifb is determined to be $Ifb=Ifb+IFS/2^{X+1}$; wherein IFS is the maximum value of the feedback current and Ifb is the actual value of the feedback current. Otherwise, the feedback compensation current is decreased to $Ifb=Ifb-IFS/2^{X+1}$; see steps 54 and 56.

In step 58, the integrator is reset, x is incremented by 1, x=x+1, and the result of either step 54 or step 56 (depending on the output of the comparison in step 52) is output as a coarse feedback compensation current Ifb_coarse, which is fed back to the compensation coil of the magnetic sensor. The output of the coarse conversion phase also can be represented by a bit vector b[0; x]. This iteration is repeated a predetermined number of times (N+1), for example N=8, as determined in step 59. The feedback current, shown in FIG. 3b by way of example, hence is generated in a very fast converging process during only a small number of clock cycles.

FIG. 4b shows a flow diagram of the delta-sigma based conversion process which will be initiated after the first N clock cycles have passed for determining the coarse feedback compensation current Ifb_coarse. The initial value of the feedback compensation current Ifb in this phase is the result of the previous coarse phase, i.e. Ifb_coarse. As in the fast conversion process, described with reference to FIG. 4a, in an initial step 60, the effective magnetic field resulting from the external magnetic field Bext and the compensation magnetic field B(Ifb) generated by the compensation current Ifb is determined as Bext−B(Ifb). Also as in the fast conversion phase, in step 62, it is determined whether this effective magnetization field is larger than 0 and, if yes, the method proceeds to step 64 whereas, if no, the method proceeds to step 66.

If the external magnetic field is larger than the compensation magnetic field, the compensation current Ifb needs to be increased, otherwise it needs to be decreased. Accordingly, in step 64, the new compensation current Ifb is calculated as Ifb=Ifb_coarse+Ids whereas, in step 66, the new compensation current Ifb is calculated as Ifb=Ifb_coarse−Ids. Accordingly, the feedback current will always be determined based on the result of the first, coarse phase wherein the current increment Ids can correspond e.g. to one, two or more last significant bits of the compensation signal fed back to the feedback DAC 40 of FIG. 2. The feedback compensation current Ifb hence is toggled by one, two or more least significant bits.

Additionally, in this second, fine conversion phase, also one or more least significant bits of the final digital output signal OUT are determined. Depending on the desired resolution, the oversampling rate (OSR) will be chosen. For an eight bit delta-sigma conversion, for example, the conversion hence runs through 256 clock cycles. The least significant bits of the digital output signal hence are calculated starting from an initial value of the bit stream bs=0 which toggles between 0 and 1 depending on the output of the comparison step 62. The least significant bits of the digital output signal finally are determined as the filtered version of the bit stream bs, as shown in step 68. For a first order delta sigma the filtering can be the mean value of the bit stream.

This sequence is repeated OSR times, depending on the desired oversampling rate (OSR) by incrementing the count, y=y+1, and checking the count value; see steps 67 and 69. After each iteration, the current iteration result out_fine can be combined with the current output signal OUT so as to determine the final digital output signal OUT. Alternatively, it is possible to generate two bit streams which can be combined at the end of the conversion, based on system accuracy requirements, or alternatively can be outputted or processed for intermediate results.

The conversion processes described above can be implemented in hardware, software or a combination thereof, including an implementation of some of all of its functions in one or more integrated circuits.

The mean output signal hence will correspond to the external magnetic field experienced by the magnetic field sensor. While the described approach takes advantage of the fast conversion phase for quickly determining the compensation feedback current, it also can take advantage of characteristics of delta-sigma conversion which can shift unwanted conversion noise from lower frequencies to higher frequencies which are outside of the detection band. This is known as noise shaping and allows to detect low frequency signal components at high signal-to-noise ratio. The higher frequencies can be removed by filtering using the digital filter unit 38 at the output of the analog-to-digital converter.

In the described example, a first order delta-sigma modulator is used but higher order modulators would be feasible.

FIG. 5 shows an alternative example of a digital magnetic sensor system which is different from the system of FIGS. 1 and 2 mainly in that an additional multiplexer unit 70 is included which allows to use the data acquisition electronics for several and different magnetic field sensors, such as a fluxgate sensor, a Hall effect sensor and a magneto resistive sensor, of even different types of other sensors for detecting any physical entity. The inputs of the multiplexer unit 70, in the example shown in FIG. 5, hence can be connected to different sensors, such as first, second and third sensors 72, 74 and 76. In a practical embodiment, all sensors can receive some type of excitation which will be different for different types of sensors.

The output of the multiplexer 70 is connected to data acquisition electronics 30 basically corresponding to the electronics shown in FIGS. 1 and 2. The same reference numbers are used for designating the same or similar functional blocks. Data acquisition electronics 30, in the embodiment of FIG. 5, comprises an integrator unit 110, a comparator 120, and a filter and digital control unit 130 connected in series, as shown in FIG. 5 and described above with reference to FIGS. 1 and 2. Also as described with reference to FIGS. 1 and 2, the output of the comparator 120 is fed back via a feedback digital-to-analog converter 140. Having regard to the function of the data acquisition electronics 30, reference is made to the description of FIG. 2. The main difference between the circuit of FIG. 5 and the circuit of FIG. 2 is that the data acquisition electronics 30 of FIG. 5 is adapted to process the output signals of a number of different sensors.

FIG. 5 also shows a superordinate control block 90 for controlling e.g. drive units (not shown) for sensors 72, 74, 76 and the data acquisition electronics 30, including the analog-to-digital converter 110, 120 and the control and filter unit 130. The control block 90 can, for example, control the analog-to-digital converter for adapting the coarse conversion process and fine conversion process to different type of sensor as well as to different system requirements and precision levels. It may further control the control and filter unit 130 for filtering the bit stream that is output by the fine conversion process and for combining the results of the coarse conversion process and the fine conversion process. Filtering, for example, can be a first order or higher order filtering of the output of the delta sigma conversion. The output of the two conversion processes can be combined with each new iteration of the fine conversion process. Alternatively, it also is possible to generate two bit streams which are combined only at the end of the conversion process, based on system requirements. The bit streams of the conversion processes also can be outputted and/or processed for intermediate results. The control block 90 also can control respective drive units (not shown in FIG. 5) for providing excitation to the sensors 72, 74, 76, and further can be configured to control the multiplexer unit 70.

The final output of the readout-circuit hence will be a combination of the bits of the first, coarse conversion phase and the filtered bit stream of the second, fine conversion phase. In its easiest form, the filter will be a first order filter for averaging the delta sigma bit stream but also higher order filters may be used. The result of both conversion phases can be stored separately or in combination and can be outputted separately or in combination. Further, the result of the coarse conversion phase can be fed back for sensor linearization. The control block also can determine the oversampling rate OSR of the delta sigma conversion. The oversampling rate will depend on overall system requirements and the desired precision of the output signal. Theoretically, as long as the magnetic field does not substantially change, the second, fine conversion phase can continue to produce a result of increasing precision, wherein, as mentioned above, it is possible to output intermediate results before the conversion process has been completed.

This control block 90 preferably is implemented in form of software or firmware.

The solutions proposed in this application combine the advantages of a fast feedback loop for sensor linearization and characteristics of delta-sigma conversion, such as high level of resolution and noise shaping capability. The solution is scalable in terms of power consumption, conversion speed and resolution. It is particular area efficient as it can reuse at least parts of the hardware for different conversion modes.

Those skilled in the art to which this application relates will appreciate that other and further additions, deletions, substitutions and modifications may be made to the described embodiments.

What is claimed is:

1. A readout circuit for a magnetic field sensor, the readout circuit comprising:
   an input stage for receiving a sensor output signal of the magnetic field sensor;
   an output stage for outputting a digital output signal corresponding to the sensor output signal;
   an analog to digital conversion circuit configured to receive the sensor output signal and to perform, in sequence:
   a fast conversion process for calculating a number of most significant bits of the digital output signal corresponding to the sensor output signal and for generating a compensation signal to be fed back to an input of the magnetic field sensor, and
   a delta sigma based conversion process for calculating at least one least significant bit of the digital output signal; and
   a feedback circuit for feeding back the compensation signal to the magnetic field sensor.

2. The readout circuit of claim 1 wherein the fast conversion process includes successive approximation.

3. The readout circuit of claim 1 wherein the analog to digital conversion circuit includes an integrator circuit and a comparator circuit.

4. The readout circuit of claim 1, wherein the compensation signal is a compensating current or voltage, and wherein the readout circuit further comprises a digital to analog converter provided in a feedback branch between an output of the analog to digital conversion circuit and the input of the magnetic field sensor for generating the compensating current or voltage.

5. The readout circuit of claim 4, wherein an output of the fast conversion process is used for generating a mean value of the compensation signal.

6. The readout circuit of claim 1 wherein the magnetic field sensor is a fluxgate sensor.

7. The readout circuit of claim 6 further comprising a demodulator between an output of the magnetic field sensor and the analog to digital conversion circuit.

8. The readout circuit of claim 1 further comprising a filter and digital control circuit at the output stage.

9. The readout circuit of claim 8 wherein the filter and digital control circuit is configured to filter an output bit stream of the delta sigma based conversion process.

10. The readout circuit of claim 9 wherein the filter and digital control circuit is configured to combine a result of the fast conversion process and the filtered output bit stream of the delta sigma based conversion process for generating the digital output signal.

11. The readout circuit of claim 1 further comprising a multi-channel unit configured for coupling the readout circuit to a plurality of magnetic field sensors.

12. A method of processing a sensor output signal of a magnetic field sensor, the method comprising:
    receiving the sensor output signal of the magnetic field sensor;
    performing an analog to digital conversion of the received sensor output signal wherein performing the analog to digital conversion includes, in sequence:
        performing a fast conversion process for calculating a number of most significant bits of a digital output signal corresponding to the sensor output signal and for generating a compensation signal to be fed back to a sensor input,
        performing a delta sigma based conversion process for calculating at least one least significant bit of the digital output signal;
        feeding back the compensation signal to the magnetic field sensor; and
        combining the most significant bits and the at least one least significant bit for generating the digital output signal corresponding to the sensor output signal; and
    outputting the digital output signal.

13. The method of claim 12 further comprising generating the compensation signal by toggling at least one least significant bit of the compensation signal based on a result of the delta-sigma based conversion process.

14. The method of claim 12 wherein the fast conversion process includes successive approximation.

15. A system for a magnetic field sensor, the system comprising:
    an input stage for receiving a sensor output signal of the magnetic field sensor;
    an output stage for outputting a digital output signal corresponding to the sensor output signal;
    an analog to digital conversion unit including an integrator and a comparator, and configured to receive the sensor output signal and to perform, in sequence:
        a fast conversion process for calculating a number of most significant bits of the digital output signal corresponding to the sensor output signal and for generating a compensation signal to be fed back to the magnetic field sensor;
        a delta sigma based conversion process for calculating at least one least significant bit of the digital output signal;
        a filter and control unit for combining an output of the fast conversion process and an output of the delta sigma based conversion process to generate the digital output signal,
        wherein the output of the fast conversion process is used for generating a mean value of the compensation signal.

16. The system of claim 15 wherein the filter and control unit is configured to perform at least one of: filtering of an output stream of the delta sigma based conversion process; separately outputting a result of the fast conversion process and a result of the delta sigma based conversion process; post-processing the result of the fast conversion process and the result of the delta sigma based conversion process; outputting intermediate results of the fast conversion process and the delta sigma based conversion process.

17. A readout circuit for a sensor, the readout circuit comprising:
    an input stage for receiving a sensor output signal of the sensor;
    an output stage for outputting a digital output signal corresponding to the sensor output signal;
    an analog to digital conversion circuit configured to receive the sensor output signal and to perform, in sequence:
        a fast conversion process for calculating a number of most significant bits of the digital output signal corresponding to the sensor output signal and for generating a compensation signal to be fed back to the sensor, and
        a delta sigma based conversion process for calculating at least one least significant bit of the digital output signal; and
    a feedback circuit for feeding back the compensation signal to the sensor.

18. The readout circuit of claim 17 wherein the sensor is configured for detecting a physical entity and the readout circuit is configured to generate a feedback quantity in a domain of the physical quantity that the sensor is measuring.

19. The readout circuit of claim 18 wherein the sensor output signal corresponds to one of: a magnetic field strength, an electromagnetic field strength, a current value, a voltage value, an electrical charge, a pressure, a temperature value, a thermodynamic entity, a light intensity, and a sound intensity.

* * * * *